United States Patent
Verhulst et al.

(10) Patent No.: US 8,232,517 B2
(45) Date of Patent: *Jul. 31, 2012

(54) WAVELENGTH-SENSITIVE DETECTOR COMPRISING PHOTOCONDUCTOR UNITS EACH HAVING DIFFERENT TYPES OF ELONGATED NANOSTRUCTURES

(75) Inventors: Anne S. Verhulst, Houtvenne (BE); Wilfried Vandervorst, Mechelen (BE)

(73) Assignee: IMEC, Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 12/574,531

(22) Filed: Oct. 6, 2009

(65) Prior Publication Data

US 2010/0171025 A1    Jul. 8, 2010

Related U.S. Application Data

(63) Continuation of application No. 11/475,300, filed on Jun. 26, 2006, now Pat. No. 7,598,482.

(60) Provisional application No. 60/704,108, filed on Jul. 29, 2005.

(30) Foreign Application Priority Data

Dec. 27, 2005   (EP) .................................... 05077989

(51) Int. Cl.
*H01L 31/00*   (2006.01)
(52) U.S. Cl. ..................................... 250/214.1; 977/954
(58) Field of Classification Search ............... 250/214.1, 250/214 R; 257/448; 977/742, 932, 933, 977/954
See application file for complete search history.

(56) References Cited

U.S. PATENT DOCUMENTS

| | | | |
|---|---|---|---|
| 6,882,051 B2 | 4/2005 | Majumdar et al. | |
| 6,996,147 B2 | 2/2006 | Majumdar et al. | |
| 7,126,467 B2 | 10/2006 | Albert et al. | |
| 2004/0147037 A1* | 7/2004 | Dai et al. | 436/147 |
| 2005/0181587 A1 | 8/2005 | Duan et al. | |
| 2005/0243410 A1 | 11/2005 | Bachmann et al. | |
| 2006/0138313 A1 | 6/2006 | Tennant et al. | |
| 2007/0116627 A1* | 5/2007 | Collier et al. | 423/447.2 |
| 2007/0196239 A1 | 8/2007 | Vink et al. | |

OTHER PUBLICATIONS

Gudiksen, et al. *Size Dependent Photoluminescence from Single Indium Phosphide Nanowires*, J. Phys. Chem B 2002, 106 pp. 4036-4039.

Wang, et al. *Highly Polarized Photoluminescence and Photodetection from Single Indium Phosphide Nanowires*, Science, vol. 293, Aug. 2001 pp. 1455-1457.

* cited by examiner

*Primary Examiner* — Francis M Legasse, Jr.
(74) *Attorney, Agent, or Firm* — Knobbe Martens Olson & Bear LLP

(57) ABSTRACT

A wavelength-sensitive detector is provided that is based on elongate nanostructures, e.g. nanowires. The elongate nanostructures are parallel with respect to a common substrate and they are grouped in at least first and second units of a plurality of parallel elongate nanostructures. The elongate nanostructures are positioned in between a first and second electrode, the first and second electrodes lying respectively in a first and second plane substantially perpendicular to the plane of substrate, whereby all elongate nanostructures in a same photoconductor unit are contacted by the same two electrodes. Circuitry is added to read out electrical signals from the photoconductor units. The electronic density of states of the elongate nanostructures in each unit is different, because the material, of which the elongate nanostructures are made, is different or because the diameter of the elongate nanostructures is different. Each unit of elongate nanostructures therefore gives a different response to incident photons such that wavelength-specific information can be derived with the device.

2 Claims, 9 Drawing Sheets

WAVELENGTH-SENSITIVE DETECTOR COMPRISING PHOTOCONDUCTOR UNITS EACH HAVING DIFFERENT TYPES OF ELONGATED NANOSTRUCTURES

CROSS-REFERENCE TO RELATED APPLICATIONS

This application is a continuation of U.S. application Ser. No. 11/475,300 filed Jun. 26, 2006, which claims the benefit under 35 U.S.C. §119(e) of U.S. provisional application Ser. No. 60/704,108, filed Jul. 29, 2005, and foreign priority benefit under 35 U.S.C. §119(a)-(d) of European Patent Application No. 05077989.1, filed on Dec. 27, 2005, the disclosures of which are hereby incorporated by reference in their entirety and are hereby made a portion of this application.

FIELD OF THE INVENTION

Wavelength-sensitive detectors using elongate nanostructures are provided, more particularly, detection systems such as photodetection systems, including photodetectors, monochromators and optics, techniques which can be used to obtain spectral information about an incident photon beam, and the use of elongate nanostructures such as Nanowires (NW) or nanotubes, e.g., carbon nanotubes (CNT).

BACKGROUND OF THE INVENTION

A photodetector is a device, which measures the intensity of an incident photon beam by outputting an electrical signal proportional to the number of incident photons. A photodetector is sensitive to incident photons, provided that the photon energy is larger than the bandgap of the photodetector material. In a conventional setup, wavelength-sensitivity is achieved for example by using spectral filters in front of the photodetector, such that only photons in a limited spectral range are incident onto the photodetector. If these filters are produced on the photodetector substrate, the processing costs will be very high. It is also a research topic on its own to develop materials, which have a sharp pass/block transition around the desired wavelength. In addition, the minimum photon energy, which can be detected, is still determined by the photodetector material. Another way to achieve wavelength-sensitivity is to use a monochromator in front of the detector. The monochromator diffracts the incident photon beam and a grating then selects a particular (narrow) spectral range of the incident photon beam, which then is incident on the detector. By scanning the grating of the monochromator, the whole spectral density of the incident photon beam can be determined. At the same time, a monochromator often takes a lot of space and requires additional equipment to control the grating of the monochromator.

Nanocrystals (NC) and nanowires (NW) have attracted considerable attention nowadays due to the interesting fundamental properties present in such low-dimensional systems and the exciting prospects for utilizing these materials in nanotechnology-enabled electronic and photonic applications.

The photonic applications of nanowires is described in Gudiksen et al. (J. Phys. Chem. B 106, 4036, 2002), specifically, size-dependent photoluminescence from single indium phosphide nanowires. This publication presents the change in peak frequency of the photoluminescent spectrum of a nanowire, as the diameter of the nanowire varies. This effect is explained by radial quantum confinement of electrons and holes in the narrow nanowires. This publication mentions the possibility to use several materials and wires with different diameters simultaneously, but this is a conventional setup, which includes for example the use of a monochromator to determine the frequency of the incident light.

Wang et al. describes highly polarized photoluminescence from and polarization-sensitive photodetection with single indium phosphide nanowires (Science 293, 1455, 2001). This publication presents a horizontal nanowire used as a photoconductor, and demonstrates the sensitivity of the nanowire to the polarization of the incident light. Suggestions are made about the use of other materials for the nanowire.

SUMMARY OF THE INVENTION

The preferred embodiments relate to a wavelength-sensitive detector. Said wavelength-sensitive detector can comprise at least a first and a second photoconductor unit. Said photoconductor units are situated on a substrate lying in a plane. Each of the at least first and second photoconductor units can comprise a first electrode having a first longitudinal direction and a first sidewall lying in a first plane parallel with the first longitudinal direction and a second electrode having a second longitudinal direction and a second sidewall lying in a second plane parallel with the second longitudinal direction, said first and second plane being substantially parallel to each other and being substantially perpendicular to the plane of the substrate.

Each individual photoconductor unit can further comprise a plurality of elongate nanostructures, each elongate nanostructure having a longitudinal axis, the axis of the elongate nanostructures being substantially parallel to each other and being substantially perpendicular to the first and second plane of the first and second electrode. Said plurality of elongate nanostructures can be positioned in between the first electrode and the second electrode.

The first photoconductor unit can further comprise a plurality of first type elongate nanostructures, and the second photoconductor unit comprises a plurality of second type elongate nanostructures, the first type elongate nanostructures being different from the second type elongate nanostructures.

A wavelength-sensitive detector is provided comprising at least a first and a second photoconductor unit on a substrate lying in a plane, each of the at least first and second photoconductor units comprising a first electrode having a first longitudinal direction and a first sidewall lying in a first plane parallel with said first longitudinal direction and a second electrode having a second longitudinal direction and a second sidewall lying in a second plane parallel with said second longitudinal direction, the first and second plane of a photoconductor unit being substantially parallel to each other and being substantially perpendicular to the plane of the substrate, wherein the first photoconductor unit comprises a plurality of first type elongate nanostructures being positioned in between the first electrode and the second electrode of the first photoconductor unit, the elongate nanostructures each having a longitudinal axis, the longitudinal axes of the first type elongate nanostructures being substantially parallel to each other and being substantially perpendicular to the first and second plane of the first and second electrodes of the first photoconductor unit, and wherein the second photoconductor unit comprises a plurality of second type elongate nanostructures being positioned in between the first electrode and the second electrode of the second photoconductor unit, the elongate nanostructures each having a longitudinal axis, the longitudinal axes of the second type elongate nanostructures being substantially parallel to each other and being substantially perpendicular to the first and second plane of the first and second electrodes of the second photoconductor unit, the first type elongate nanostructures being different from the second type elongate nanostructures.

The term "elongate nanostructures" as used herein is a broad term, and is to be given its ordinary and customary meaning to a person of ordinary skill in the art (and is not to be limited to a special or customized meaning), and refers without limitation to any two-dimensionally confined pieces of solid material in the form of wires (nanowires), tubes (nanotubes), rods (nanorods) and similar elongated substantially cylindrical or polygonal nanostructures having a longitudinal axis. A cross-dimension of the elongate nanostructures preferably lies in the region of 1 to 500 nanometers. According to the preferred embodiments, organic elongate nanostructures, such as e.g. carbon nanotubes, or inorganic elongate nanostructures, such as e.g. semiconducting nanowires (e.g. silicon nanowires) can be used.

The elongate nanostructures in each photoconductor are preferably formed of a semiconducting material. The plurality of elongate nanostructures can for example be single walled carbon nanotubes.

The plurality of elongate nanostructures in each of the first and second photoconductor units preferably have substantially a same diameter and can be formed of a same material. According to the preferred embodiments, the plurality of elongate nanostructures in said first photoconductor unit (also referred to as first type elongate nanostructures) and the plurality of elongate nanostructures in said second photoconductor unit (also referred to as second type elongate nanostructures) are different from each other. For example, they can be different from each other in material and/or diameter.

As an alternative the wavelength-sensitive detector can comprise at least one photoconductor unit wherein the plurality of elongate nanostructures in at least one of the first and second photoconductor units are partly n-type doped and partly p-type doped such that a pn diode is created within said at least one photoconductor unit.

In a preferred set-up the plurality of elongate nanostructures in a photoconductor unit can be stacked next to and/or on top of each other. The plurality of elongate nanostructures can be positioned in an array comprising rows and columns of elongate nanostructures. According to some embodiments, the array can be a periodic array.

The first and second electrodes of a photoconductor unit are preferably made of conductive materials, such as e.g. metals, alloys, poly-Si, metal-silicides, etc.

The plurality of elongate nanostructures used in the at least first and second photoconductor units preferably have a diameter from 0.3 nm up to 300 nm and more preferred a diameter smaller than 100 nm, i.e. a diameter from 0.3 nm to 100 nm.

The plurality of elongate nanostructures used in the photoconductor units can be made of any of group IV materials or binary compounds thereof, group III/V materials or binary, tertiary or quaternary compounds thereof, or group II/VI or binary, tertiary and quaternary compounds thereof.

Optionally the plurality of elongate nanostructures used in the photoconductor units can have a doping profile.

Optionally the plurality of elongate nanostructures in the photoconductor units can be embedded in a material which is transparent in the range of wavelengths to be detected or in the range of photon energies of interest.

A preferred and alternative set-up for the wavelength-sensitive detector of the preferred embodiments can comprise at least a first and a second photoconductor unit whereby the first photoconductor unit is situated between the substrate and the second photoconductor unit. Said second photoconductor unit can further be characterized as having a plurality of second type elongate nanostructures with a larger bandgap than the plurality of first type elongate nanostructures in the (underlying) first photoconductor and/or can be characterized as having a plurality of second type elongate nanostructures oriented in a direction being substantially perpendicular with the direction of the plurality of first type elongate nanostructures in the first photoconductor unit.

The wavelength-sensitive detector of the preferred embodiments can be used for determining a frequency of incident radiation, e.g. light.

The wavelength-sensitive detector of the preferred embodiments can be used for determining a polarization direction of incident radiation, e.g. light. To determine the polarization direction of the incident radiation, e.g. light, the wavelength-sensitive detector can comprise at least a first and second photoconductor unit wherein the first photoconductor unit can comprise first type elongate nanostructures oriented in a first direction and the second photoconductor unit can comprise second type elongate nanostructures oriented in a second direction. Said first and second direction can preferably be substantially perpendicular with respect to each other.

The wavelength-sensitive detector of the preferred embodiments can be used for converting an optical signal into an electrical signal and determining a frequency of incident light at the same time.

The wavelength-sensitive detector of the preferred embodiments can be used for representing one pixel of a color sensitive camera.

The preferred embodiments further provide a method for manufacturing a wavelength-sensitive detector unit. The method comprises providing a substrate lying in a plane and providing on said substrate a first and a second photoconductor unit. Providing a photoconductor unit comprises providing a first electrode, having a first longitudinal direction and having a first sidewall lying in a first plane substantially parallel with the first longitudinal direction, providing a second electrode, having a second longitudinal direction and having a second sidewall lying in a second plane substantially parallel with the second longitudinal direction, the first plane and the second plane being substantially parallel to each other and being substantially parallel to the plane of the substrate. Providing a photoconductor unit furthermore comprises providing a plurality of elongate nanostructures having ends, the ends of the elongate nanostructures being attached to the first and second sidewall of the first and second electrode, each elongate nanostructure having a longitudinal axis, the longitudinal axes of the plurality of elongate nanostructures being substantially parallel to each other and being substantially perpendicular to the first and second plane of the first and second electrode. According to the preferred embodiments, providing the first and second photoconductor units comprises providing a first photoconductor unit with a first type of elongate nanostructures and a second photoconductor unit with a second type of elongate nanostructures, the first type of elongate nanostructures being different from the second type of elongate nano structures.

The sidewall of said first electrode can be used as catalyst for elongate nanostructure growth, alternatively catalyst particles can be deposited on the first electrode before elongate nanostructure growth.

Furthermore a second electrode is provided, said second electrode having a second longitudinal direction and a second sidewall lying in a second plane substantially parallel to the second longitudinal direction, the first plane (from the first electrode) and second plane being substantially parallel to each other and being substantially perpendicular to the plane of the substrate.

Within a photoconductor unit the start points and respectively ends of said plurality of elongate nanostructures are attached to respectively the first and second sidewall of the first and second electrode, or in other words, the plurality of elongate nanostructures are positioned in between the first and second electrode, said plurality of elongate nanostructures have their axis substantially parallel to each other and substantially perpendicular to the first and second plane of the first and second electrode. According to the preferred embodiments, providing a first photoconductor unit can comprise providing a plurality of first type elongate nanostructures and providing a second photoconductor unit can comprise providing a plurality of second type elongate nanostructures, the first type and second type elongate nanostructures being different from each other, for example being different in diameter or comprising a different material.

The step of providing a plurality of elongate nanostructures can preferably be performed by growing elongate nanostructures by means of chemical vapor deposition (CVD) or pulsed laser deposition techniques (PLD). The step of providing a plurality of elongate nanostructures can be performed by growing elongate nanostructures onto the first sidewall of the first electrode.

According to the preferred embodiments, before growing a plurality of elongate nanostructures, catalyst particles can be deposited onto the first sidewall of the first electrode which can be used to start elongate nanostructure growth.

Optionally a transparent material can be deposited in between the plurality of elongate nanostructures. Said material can be a sacrificial material that can be removed after the manufacturing of the at least first and second photoconductor units.

The method for manufacturing the wavelength-sensitive detector can furthermore comprise steps for adding additional signal-processing circuitry to the at least first and second photoconductor units.

BRIEF DESCRIPTION OF THE DRAWINGS

Exemplary embodiments are illustrated in referenced figures of the drawings. It is intended that the embodiments and figures herein are to be considered illustrative rather than restrictive.

FIG. 6A shows the photoluminescence spectra at varying nanowire diameters and FIG. 6B displays the photon energies of the peak maxima of the photoluminescence spectra as a function of nanowire diameter.

DETAILED DESCRIPTION OF THE PREFERRED EMBODIMENT

Figure 1:
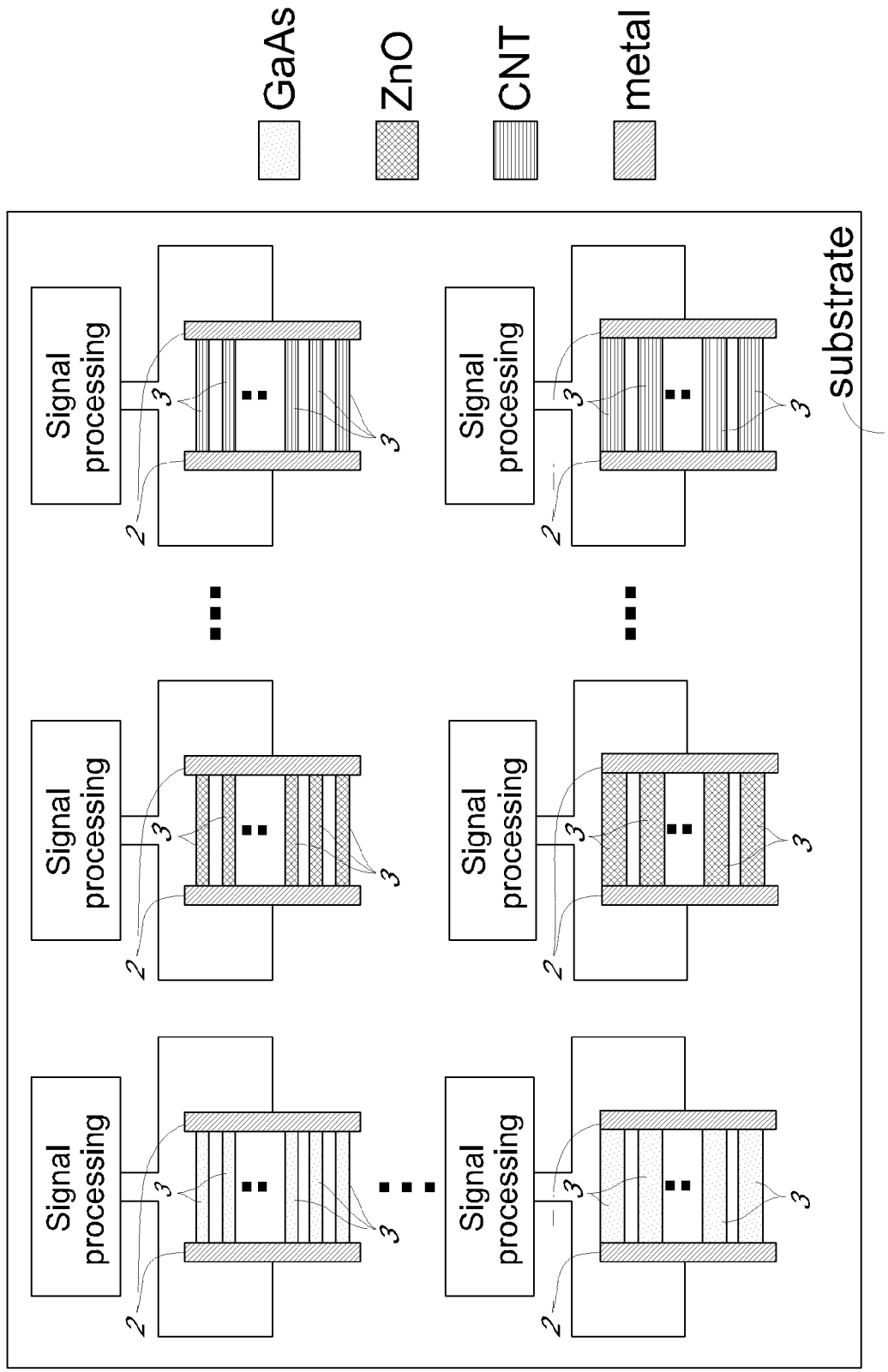
FIG. 1 shows a top view of the wavelength sensitive photodetector as presented in the preferred embodiments with the use of nanowires.

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

In particular, the preferred embodiments relate to nanowires. This, however, is not intended to be limiting. It is to be understood that, whenever "nanowire(s)" is mentioned herein, this is to be read and understood as the more general terminology "elongate nanostructure." The nanowires can be replaced by any other suitable elongate nanostructure, in particular any two-dimensionally confined pieces of solid material in the form of wires (nanowires), tubes (nanotubes), rods (nanorods), and similar elongated substantially cylindrical or polygonal nanostructures having a longitudinal axis.

A wavelength sensitive photodetector is provided, more specifically, a wavelength sensitive photodetector based on nanowires (NW). A cross-dimension of the nanowires preferably is from 1 to 500 nanometers. According to the preferred embodiments, organic nanowires, such as e.g. carbon nanotubes, or inorganic nanowires, such as e.g. semiconducting (e.g. silicon) nanowires can be used. More specifically, the creation of one silicon chip comprising units of horizontally stacked nanowires is provided whereby the ensemble of these units functions as a wavelength-sensitive detector. One single unit of horizontally stacked nanowires is further characterized as a unit comprising NW or CNT whereby said NW or CNT are made from same material and have a substantially same diameter and length. Different units comprising horizontally stacked NW or CNT are combined whereby the ensemble of these units functions as a wavelength sensitive detector. More specifically, each unit of nanowires acts as a photoconductor, which turns on when the photon energy of the light is above a certain value. The different units, which are combined on the chip to form a wavelength-sensitive detector, differ from each other in material and/or diameter. Most preferred the different units of NW or photoconductor units are situated on one single chip. Preferably each individually photoconductor unit comprising horizontally stacked nanowires of same material is such that the stacking of the nanowires is parallel to the substrate (e.g. a silicon wafer) on which the photoconductor unit is attached. Preferably the material of the NW is semiconducting; in case of carbon nanotubes, so-called "metallic" carbon nanotubes can also be used. Examples of materials that can be used to produce said (semiconducting) NW are group IV materials such as Si, Ge, C and binary compounds thereof, group III/V materials such as In, Ga, As, Sb, Al, P, B, N and binary, tertiary and quaternary compounds thereof and group II/VI materials such as Cd, Zn, S, Se, Te, O and binary, tertiary and quaternary compounds thereof. Preferred examples are e.g. GaAs, InP, ZnO, $GaAs_xP_y$, AlGaAs, semiconducting carbon nanotubes, etc. The diameter of said nanowires (carbon nanotubes) is preferably from 0.3 nm up to 300 nm. Preferably the nanowires are free standing but they can also be embedded in a material, which is transparent in the range of photon energies of interest. In said photoconductor unit, preferably both sides (or, in other words, both ends) of said horizontally stacked nanowires are connected to an electrode, said electrodes being a conductive material that is further connected to a signal processing box. Most preferred, the conductive material of the electrodes used to connect both ends of the nanowires are of the same material. Preferred materials for these electrodes are metals, poly-Si, alloys, or silicides.

To create a wavelength sensitive photodetector different photoconductor units need to be combined, preferably on the same substrate. The different units are either made of nanowires with different materials e.g. originating from group IV materials such as Si, Ge, C and binary compounds thereof, group III/V materials such as In, Ga, As, Sb, Al, P, B, N and binary, tertiary and quaternary compounds thereof and group II/VI materials such as Cd, Zn, S, Se, Te, O and binary, tertiary and quaternary compounds thereof. Examples of these materials are GaAs, InP, ZnO, $GaAs_xP_y$, AlGaAs, carbon nanotubes (CNTs), etc, or the different units are made of nanowires with same material but with different diameters. In this way, the bandgap of the nanowires in each unit will be different. Therefore, if a photon beam of a particular frequency is irradiating the chip, all units for which the photon beam is above the bandgap will turn on, and all units for which the photon energy of the light is below the bandgap will remain off. In this way, the chip acts as a wavelength-sensitive photodetector. The signal processing of all the individual photoconductor units is preferably on-chip, but can also be partially off-chip (=software program).

In a preferred embodiment a method is also provided for fabricating the individual nanowires. Preferably the method to fabricate the individual nanowires (or carbon nanotubes) starts with the production and deposition of catalyst particles. The crystalline nanowires or carbon nanotubes are then grown by for example Chemical Vapor deposition (CVD). The additional circuitry can be fabricated before or after the nanowire growth. It must be clear that there are many different alternatives to produce the structures of preferred embodiments. For example, the nanowires can also be produced beforehand, and then only be incorporated afterwards onto the substrate.

In a preferred embodiment a method is provided whereby the sensitivity of the individually photoconductor units can be increased by increasing the number of horizontal wires in the 2D array, or by using a 3D structure. The vertical stacking increases the sensitivity, as long as the length of nanowire material in the vertical dimension is not larger than the absorption length, at which point most of the light is absorbed by the above-lying nanowires. The sensitivity is also determined by the size of the chip, because the incident beam is illuminating the whole chip at the same time.

The wavelength sensitivity of the photodetector can be improved by vertical stacking of different units. The top unit is by preference such, that the bandgap is larger than the bandgap of the underlying unit. In this case, the light, which falls onto the underlying unit, does no longer contain the photons which are absorbed by the top unit. Therefore, the signal produced by the underlying unit is solely due to photons in the spectral range which is above the bandgap of the unit, but not in the range of absorption of the top unit.

The polarization of the incident light can also be determined, by producing units with substantially same nanowires but with orthogonal orientations. This is because the incident light is only absorbed if the polarization of the light is along the direction of the nanowire length.

Preferably the diameters of the nanowires used in the individual photoconductor units are small enough such that the growth of crystalline wires is possible. This typically requires nanowire diameters below 100 nm. To get a bandgap shift with decreasing diameter, the diameter has to be small enough such that confinement effects are showing up. The diameter at which this starts is material dependent, but the shift typically starts at diameters of about 10 nm. If the nanowires are carbon nanotubes, the diameters are typically on the order of from 0.5 nm to 6 nm.

In an alternative embodiment, the (semiconducting) nanowires of the photoconductor units can have a doping profile and form photodiodes, such as pn-diodes, p-i-n diodes, avalanche photodiodes, etc. A photoconductor unit containing photodiodes is then called a photodiode unit. In general, in photodiode units the electrical response is faster compared to the previous described photoconductor units.

The photoconductor units of the preferred embodiments are useful in several applications. A first application area is within the field of color sensitive cameras wherein for example three different photoconductor units comprising nanowires represent one pixel of color sensitive camera.

A second application area is within the field of telecommunications wherein the wavelength sensitive detector converts the optical signal into an electrical signal while at the same time determining the frequency of the incident light beam.

The third application is within the field of spectroscopy to create a wavelength sensitive detector that can be used to determine the frequency of incident light and optionally the polarization of the incident light.

The following description illustrates in a first part a set up for the creation of a wavelength sensitive photodetector device making use of photoconductor units of the preferred embodiments comprising nanowires (or carbon nanotubes). In a second part some application areas are demonstrated using the wavelength sensitive photodetector device of the preferred embodiments.

I. Set Up for the Creation of a Wavelength Sensitive Photodetector Device Making Use of Photoconductor Units Comprising Nanowires A wavelength-sensitive photodetector is provided that is based on nanowires (NW) or carbon nanotubes (CNT). The NWs are parallel with respect to a common substrate and they are grouped in units of one or more parallel nanowires. On both sides of the nanowire, there is an electrode, whereby all nanowires in the same unit are contacted by the same two electrodes. Circuitry is added to read out electrical signals from the nanowire units. The electronic density of states of the nanowires in each unit is different, because the material of which the nanowires are made is different or because the diameter of the nanowire is different. Each unit of nanowires therefore gives a different response to incident photons such that wavelength-specific information can be derived with the device provided.

The crystalline growth of nanowires of different materials on a Si chip, together with the diameter dependence of the bandgap, are combined to make a versatile detector, which is wavelength sensitive (=without the use of additional hardware to distinguish wavelengths) and (optionally) polarization sensitive.

Figure 6A:
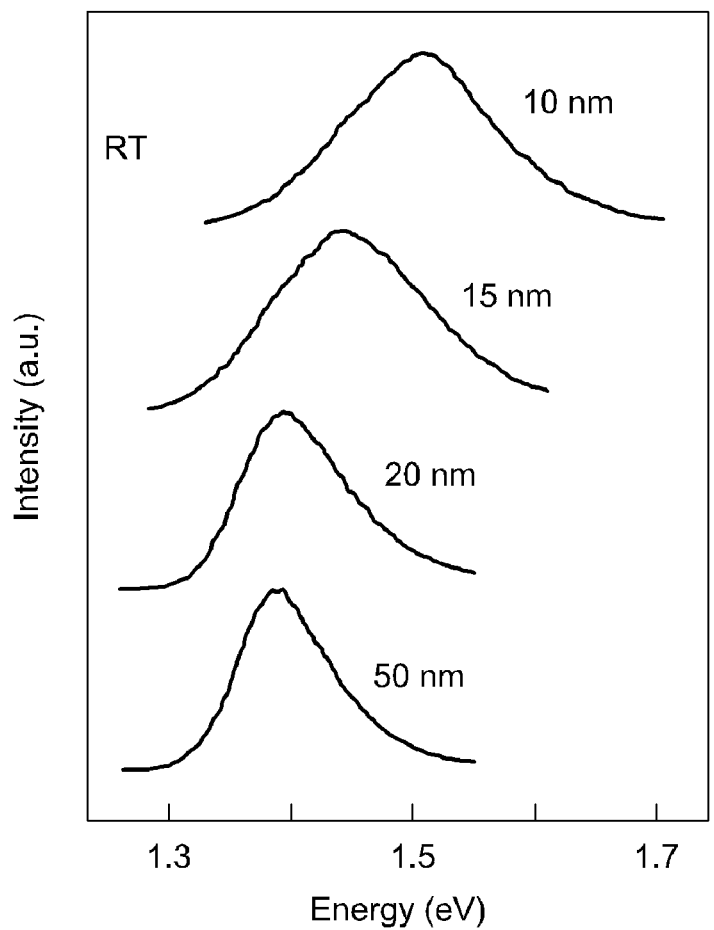
FIGS. 6A-6B (PRIOR ART) display photoluminescence data of InP nanowires as a function of nanowire diameter.
Figure 6B:
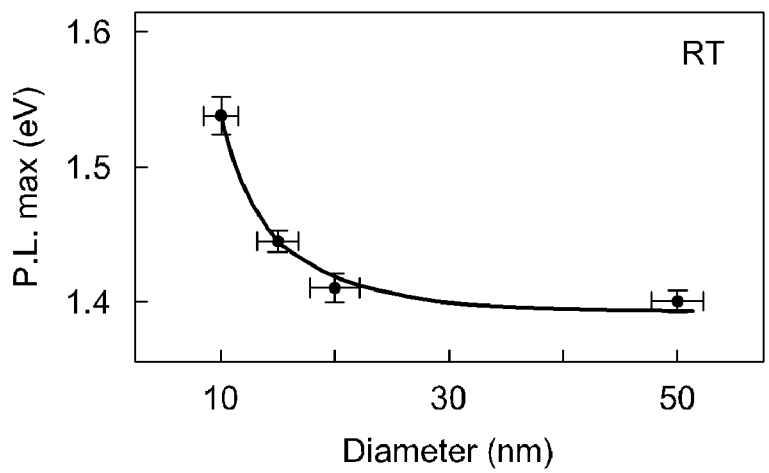
Figure 7:
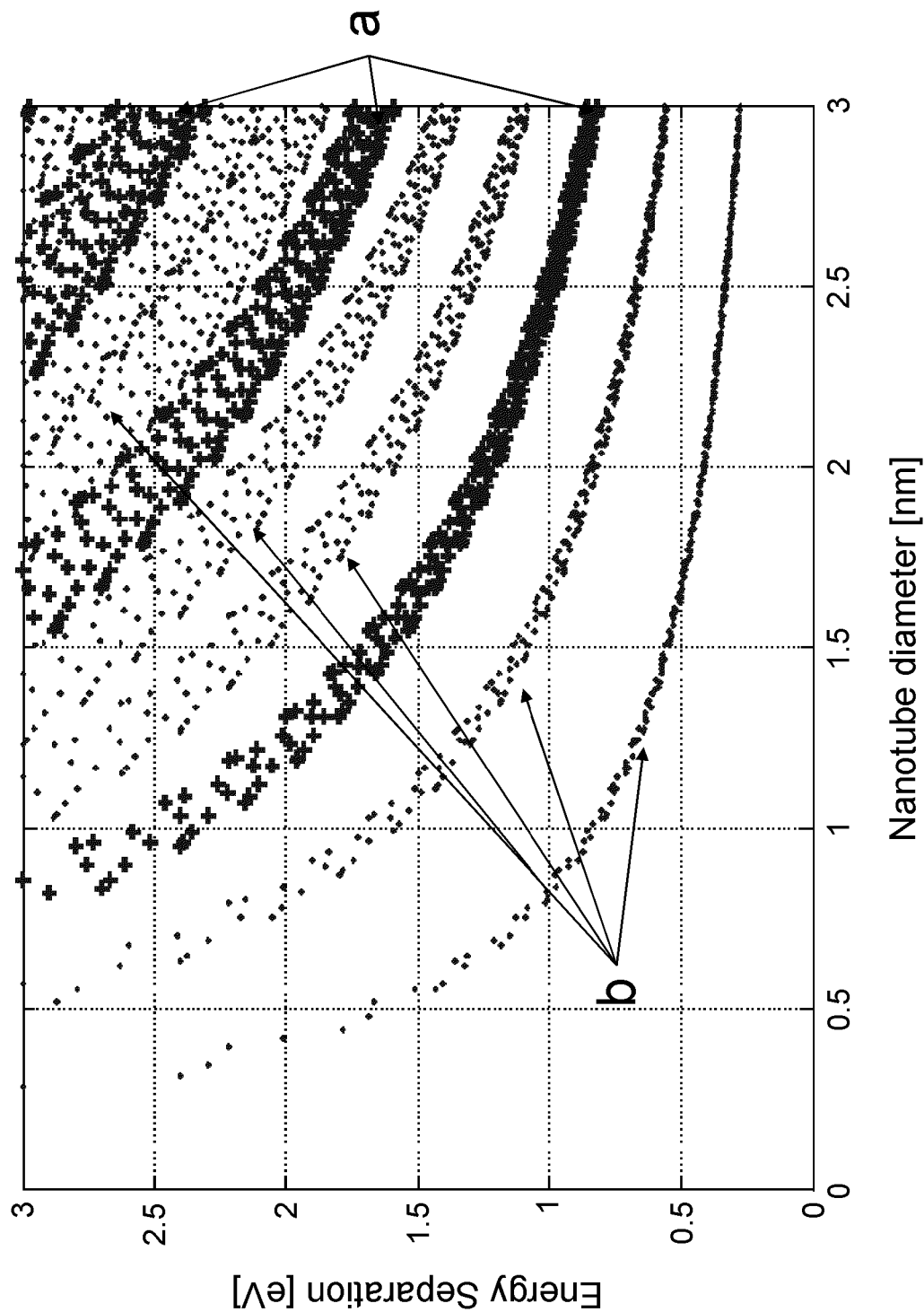
FIG. 7 (PRIOR ART) is a Kataura plot (theoretical calculation) of the Van Hove singularities in metallic (a) and semiconducting (b) carbon nanotubes.

The preferred set-up to create said wavelength-sensitive photodetector comprising different photoconductor units is illustrated in FIG. 1 and described in detail below. As shown schematically in FIG. 3 for one photoconductor unit, the starting point is a substrate 1, preferably said substrate is a silicon or $SiO_2$ substrate. On said substrate 1 vertical structures 2 are created, said vertical structures are preferably made of conductive material such as metals, alloys, poly-Si or silicides and these structures can be used in the wavelength-sensitive photodetector as electrodes. In between vertical structures 2 at least one and preferably more than one nanowires (or carbon nanotubes) are grown. Said nanowires 3 in one particular photoconductor unit are preferably of a same material, diameter and length. The material of the nanowires is preferably a semiconducting material. Examples of these materials are group IV materials such as Si, Ge, C and binary compounds thereof, group III/V materials such as In, Ga, As, Sb, Al, P, B, N and binary, tertiary and quaternary compounds thereof and group II/VI materials such as Cd, Zn, S, Se, Te, O and binary, tertiary and quaternary compounds thereof. Preferred examples of these materials are GaAs, InP, ZnO, $GaAs_xP_y$, AlGaAs, semiconducting carbon nanotubes (CNTs). Preferably the diameter of the nanowires is from 0.3 nm up to 300 nm. The different photoconductor units are either made of different material, or they are made of the same material, but with a different diameter (and/or chirality in the case of CNTs). If there is only a difference in diameter between different units, then the diameter variation is such that the electronic density of states of the units is different. The density of states of a material is dependent on the diameter, once the diameter of the nanowire is so small, that quantum confinement effects occur. One of the effects of quantum confinement is that the bandgap of a semiconducting material increases with decreasing diameter, as is illustrated in FIGS. 6 and 7. FIG. 6A shows the photoluminescence spectra at varying nanowire diameters and FIG. 6B displays the photon energy of the peak maxima of the photoluminescence spectra. FIG. 7 is a Kataura plot (theoretical calculation) of the Van Hove singularities in metallic (a) and semiconducting (b) carbon nanotubes. The nanowires in one photoconductor unit are parallel to each other and parallel to the underlying substrate. The nanowires are by preference free-standing, but they can also be embedded in a material which is transparent in the range of photon energies of interest. Each unit can further contain some circuitry to process the electrical output signal upon incident light.

Several fabrication methods to create said nanowires can be implemented. A preferred fabrication method starts by first producing catalysts of substantially the same diameter and material. These catalyst particles can be directly deposited on the sidewalls of said vertical structures 2 on the substrate 1. The crystalline nanowires or carbon nanotubes are then grown by for example Chemical Vapor deposition (CVD). Alternatively the nanowires (or carbon nanotubes) can be grown on a sacrificial substrate first and subsequently be transferred to the final substrate 1. One or both of said vertical structures 2 can also be created after the growth or after the transfer of the nanowires onto the final substrate. Transparent or sacrificial material can optionally be deposited in between the nanowires (carbon nanotubes) for mechanical support during the fabrication process. The additional signal-processing circuitry can be fabricated before or after the nanowire growth. There are many different alternatives to produce the structures of preferred embodiments. The above procedures are given as examples only.

The wavelength-sensitive photodetector device operation can be described as follows. The light of the incident beam falls onto the substrate, and is incident on all units at the same time. Only those units will produce an electrical signal, for which the photon energy of (part of) the incident photons is such that these photons are absorbed by the nanowires. A necessary condition to get absorption is that the photon energy is above the bandgap of the nanowires. The structure therefore permits determination of e.g. the minimum photon energy of the incident light beam, by evaluating which units have turned on and which remained off. The signal produced by the units is also proportional to the number of absorbed photons. Knowledge of the electronic density of states of the nanowires in the different units and comparison of the signal intensities of the different units, which turned on, provide further spectral information. As an example, if one unit absorbs photons with energy above $E_1$, and if a second unit absorbs photons with energy above $E_2$, and if $E_1 > E_2$, then all photons with energy such that they can be absorbed by the first unit, can also be absorbed by the second unit. Therefore, the signal intensity of both units is related, and by comparison the spectrum of the incident light beam can be reconstructed. As another example, once the nanowires are narrow enough, the density of states approaches one-dimensional behavior (see FIG. 8), which means that there are parts of the above-bandgap photons for which there is strong absorption and there are parts where there is very weak absorption. The signal of each unit is therefore the integral of the multiplication of the spectrum of the incident photon beam with the spectral response function of the nanowires in the unit. The more units are present, the better the incident spectrum can be reconstructed. The resolution of the resulting spectrum can be determined by the difference in electronic density of states between the different units. Typically, a resolution of 10 meV or less is expected for most of the optical spectrum up to 3 eV.

Figure 3:
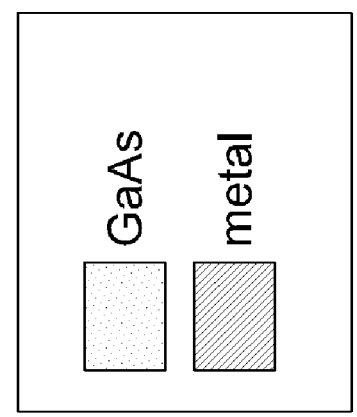
FIG. 3 shows a side view on a partial unit of nanowires showing a three dimensional (3D) stacking of the nanowires (both horizontally and vertically extending arrays), according to an aspect of the preferred embodiments.
Figure 3:
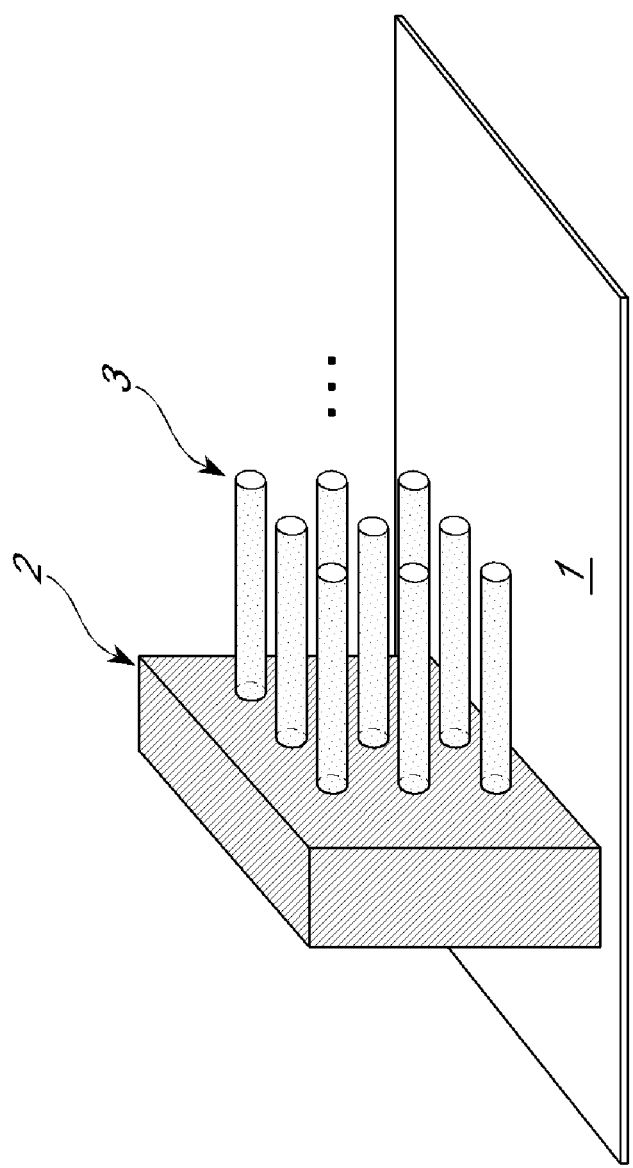

The sensitivity of the wavelength-sensitive photodetector can be increased by increasing the number of horizontal wires, or by using a 3-dimensional stacking as shown in FIG. 3. The vertical stacking increases the sensitivity, as long as the length of nanowire material in the vertical dimension is not larger than the absorption length, at which point most of the light is absorbed by the above-lying nanowires.

Figure 4:
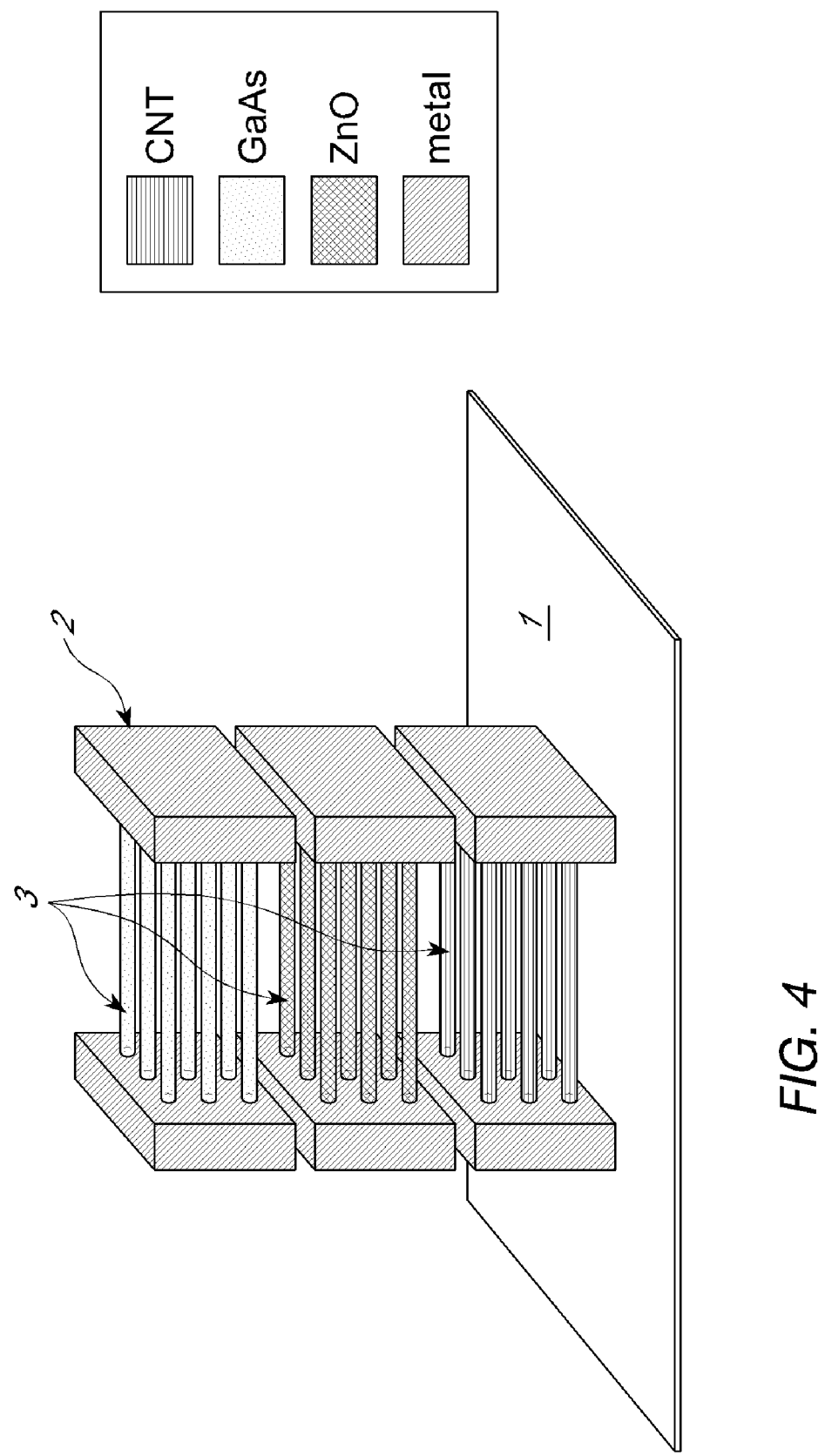
FIG. 4 shows a side view on three units of nanowires, which are vertically stacked, according to another embodiment.

The wavelength selectivity of the photodetector can be improved by vertical stacking of different units, as shown in FIG. 4. The top unit is by preference such, that the bandgap is larger than the bandgap of the underlying unit. In this case, the light which falls onto the underlying unit does no longer contain the photons which are absorbed by the top unit. Therefore, the signal produced by the underlying unit is solely due to photons in the spectral range which is above the bandgap of the unit, but not in the range of absorption of the top unit.

The size of the nanowires (carbon nanotubes) is small enough such that growth of crystalline wires is possible. This typically means nanowire diameters below 100 nm. To get a bandgap shift with decreasing diameter, the diameter is small enough such that confinement effects are observed. The diameter at which this starts is material dependent, but the shift typically starts at diameters of about 10 nm. If the nanowires are carbon nanotubes, the diameters are typically on the order of from 0.5 nm to 6 nm.

To have a wide spectral range covered by the photodetector, the materials within the different photoconductor units are selected accordingly. Single wall carbon nanotubes offer wavelength-selectivity in the range of 0.3 eV to above 3V (see FIG. 7 wherein the semiconducting carbon nanotubes are indicated as b), InP nanowires offer selectivity in the range of 1.4 eV to above 1.55 eV, GaAs nanowires at energies around 1.4 eV, ZnO nanowires at energies around 3.2 eV, etc.

The wavelength resolution of the wavelength-sensitive photodetector is determined by the difference in bandgap energy of two subsequent photoconductor units. Typically, a resolution of 10 meV or less is expected for most of the optical spectrum up to 3 eV.

Figure 2:
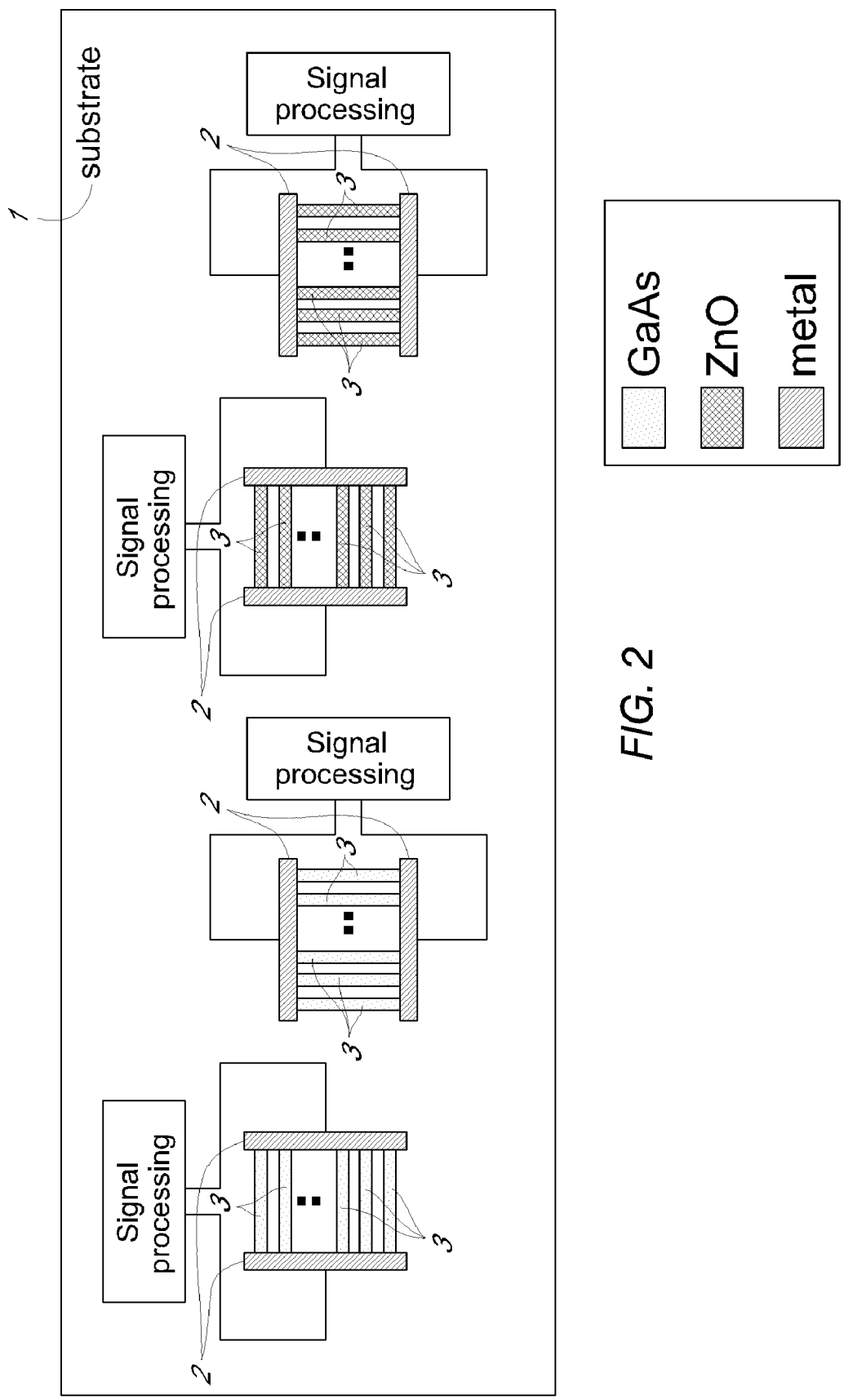
FIG. 2 shows a top view of a wavelength sensitive photodetector structure, which includes both orientations of wires on chip such that also the polarization of the light is being measured.

The polarization of the incident light can also be determined, by producing units with same nanowires but with orthogonal orientations as shown in FIG. 2. This is because the incident light is only absorbed if the polarization of the light is along the direction of the nanowire length.

Figure 5:
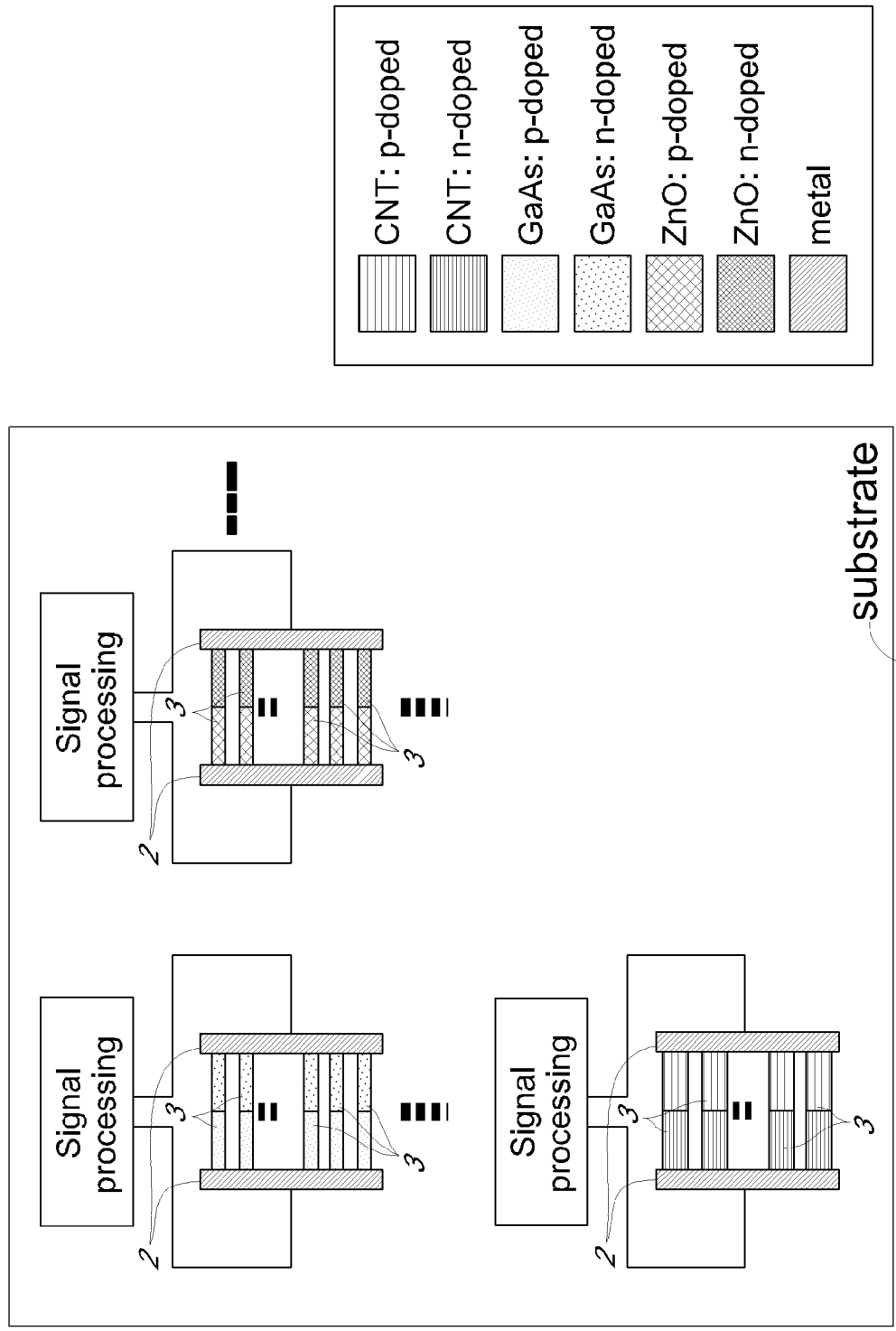
FIG. 5 shows a top view on a photodetector structure showing nanowires with a pn-junction, according to another embodiment.

In an alternative embodiment, the (semiconducting) nanowires of the above described photoconductor units can have a doping profile and form photodiodes, such as pn-diodes, p-i-n diodes, avalanche photodiodes, etc. A photoconductor unit containing photodiodes is then called a photodiode unit. In general, a photodiode contains a p-doped section and an n-doped section. A p-doped section has either a constant or a varying p-type doping profile and an n-doped section has either a constant or a varying n-type doping profile. In the case of pn-diodes, each photodiode unit consists of two electrodes, in between which there are nanowires which consist of two sections: a p-doped section (e.g. left section) and an n-doped section (e.g. right section), as is shown in FIG. 5. The wavelength-sensitive photodetector with photodiode units consisting of pn-diodes is preferred for high-speed applications. In the case of p-i-n-diode nanowires, the nanowires consist of three sections: a p-doped section (left), an intrinsic section (center), and an n-doped section (right) (not shown in a figure). The p-i-n diode based units are preferred if both speed and quantum efficiency are desired (with quantum efficiency being the number of electron-hole pairs generated per incident photon). An avalanche photodiode is a photodiode, which operates at high reverse-bias voltages, and which has a structure is similar to the pn-diode. In general, in photodiode units the electrical response is faster compared to the previous described photoconductor units.

Combinations of the above-mentioned alternative embodiments are also provided, such as e.g. vertical stacking of two photoconductor units with orthogonal orientations of the nanowires, or like vertical stacking of photodiode units. How devices of these embodiments respond and how they are built are clear to a person skilled in the art.

The nanowire-based photodetector provides several advantages over conventional wavelength-sensitive photodetection systems. A first advantage is the fact that the photodetector of the preferred embodiments does not require any additional or external components to obtain information on the wavelength of the incident light beam. A unit which turns on provides information on the wavelength of the incident light.

Another advantage of the devices of preferred embodiments is that the selection of units with different bandgaps and different electronic density of states can be done very systematically, because the bandgap of semiconducting materials is well-known today, and the variation of the electronic density of states due to quantum confinement effects can be predicted by theoretical calculations.

Another advantage is the extremely large spectral range which can be covered by the nanowire-based photodetectors of the preferred embodiments. The spectral range in conventional photodetector and filter systems is limited by the spectral range of the photodetector material, and the spectral range in conventional spectrometer setups (=monochromator+photodetector) is further limited by the grating of the spectrometer. In the preferred embodiments, however, units with nanowires of very high bandgap materials and of very low bandgap materials can be combined, such that the widest ever spectral range is covered by one detector.

Another advantage is that the nanowire units are inherently small, and that the filtering and detection of the incident light occurs in the same unit. This is especially desirable for telecommunications applications, because the wavelength-sensitive photodetector converts the optical signal of the incident beam in an electrical signal, while at the same time determining the frequency of the incident beam. With some additional on-chip logic circuitry, the signal can be directed into the post-processing box for that particular frequency with hardware components only.

II. Application Areas Using a Wavelength Sensitive Photodetector Device Comprising Nanowires (Carbon Nanowires)

Three application fields for the wavelength sensitive photodetector devices of the preferred embodiments are briefly shown and described. In each of the applications, the photoconductor units utilize stacking of preferably nanowires with same characteristics that are combined with each other and preferably placed on one single chip such that it meets the requirements of each application. However, several alternatives to the applications described below are possible and thus the device structures are not limited to the description below.

Figure 8:
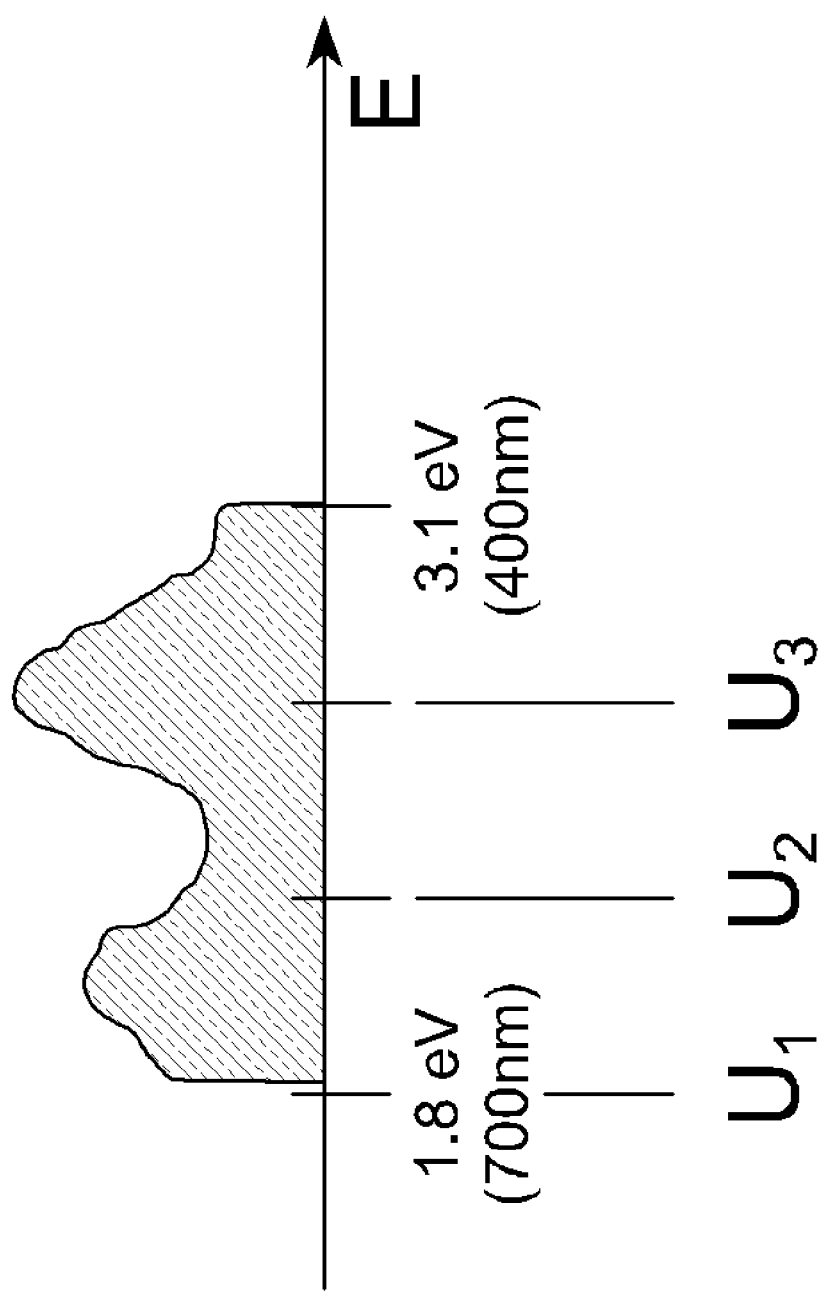
FIG. 8 illustrates the color-sensitive camera application. It shows a potential spectrum of an incident light beam and the preferred bandgap of the three units of nanowires ($U_1, U_2, U_3$) which together represent one pixel of the color-sensitive camera.

The first application field is within the field of cameras, more specifically in the field of color-sensitive cameras. Conventionally, each pixel of a color-sensitive camera consists of three silicon detectors, each with a color-sensitive filter in front of them in order to distinguish between the three basic colors: red, green, and blue. Each pixel can be represented with three (or more if higher color resolution is desired) units of the basic structure of FIG. 1. More specifically, each pixel can be represented by NW (or CNT) based photoconductor units, which are situated on one single chip. It is further provided that the bandgap of the three photoconductor units covers the visible regime evenly, that is, for example (see FIG. 8) one unit has a bandgap close to the lowest visible photon energy (red, about 700 nm=1.78 eV), one unit has a bandgap close to the onset of green light (about 600 nm=2.07 eV) and one unit has a bandgap close to the onset of blue light (about 500 nm=2.48 eV). A filter, transmitting only the visible light, is optionally employed in front of the nanowire-camera chip. The optical properties (absorption length, density of states, sensitivity, and the like) of the structures in each unit are determined. FIG. 8 illustrates the color-sensitive camera application. FIG. 8 shows a potential spectrum of an incident photon beam and the preferred bandgap choice for the three photoconductor units (further referred to as $U_1$, $U_2$ and $U_3$) comprising NWs (or CNTs), which represent one pixel of a color-sensitive camera.

The mechanism of color determination can be described as follows. The signal of photoconductor unit $U_3$ determines the amount of light in the spectral range corresponding to blue light (500 nm-400 nm) as shown in FIG. 8. From the signal of $U_3$ and based on knowledge of the optical properties of photoconductor unit $U_2$, the background signal $S_{2,background}$ of $U_2$ due to light in the spectral range of (500 nm-400 nm) can be determined. The signal of $U_2$ minus the signal $S_{2,background}$ then determines the amount of light in the spectral range corresponding to the green light (600 nm-500 nm). From the signal of $U_3$ and $U_2$, and based on knowledge of the optical properties of $U_1$, the background signal $S_{1,background}$ of $U_1$ due to light in the spectral range of (600 nm-400 nm) can be determined. The signal of $U_1$ minus the signal $S_{1,background}$ then determines the amount of light in the spectral range corresponding to the red light (700 nm-600 nm).

Preferred materials for photoconductor unit $U_1$ are e.g. $Al_{1-x}Ga_xAs$, InP, or GaAs. Preferred materials for photoconductor unit $U_2$ are e.g. $Cu_2O$, and preferred materials for photoconductor unit $U_3$ are e.g. CdS.

The second application field is within the field of telecommunications, more specifically, the wavelength-sensitive detector is used to convert the optical signal in an electrical signal while at the same time the frequency of the incident light beam is determined. Typical light beams for telecommunications have a narrow spectral range, such that the photon energy is given by the bandgap of the nanowire-unit with the narrowest bandgap of the units which turn on. The signal of all incident light beams can therefore fall on the same detector: with some additional on-chip circuitry, the obtained frequency information can be used to direct the signal into the post processing box for that particular frequency.

The third application field is within the field of spectroscopy, more specifically, the wavelength-sensitive detector of the preferred embodiments is used to determine the frequency spectrum of the incident photons. If the spectral response of all units is well-known and if post processing is used, the optical spectrum of the incident light can be constructed. This is achieved based on the spectral response of the different photoconductor units (which can be obtained via calibration of the different photoconductor units), and on the fact that from the signal of units with a large bandgap, the minimum expected signal in units with a smaller bandgap (which is then due to this high-energy photons) can be determined. More specifically, if for a particular unit, the signal is stronger than the predicted minimum signal due to high-energy photons, than it can be concluded that there is light in the spectral range between the bandgap of the unit under consideration and the bandgap of the unit with the smallest of the higher-energy bandgaps.

Figure 9:
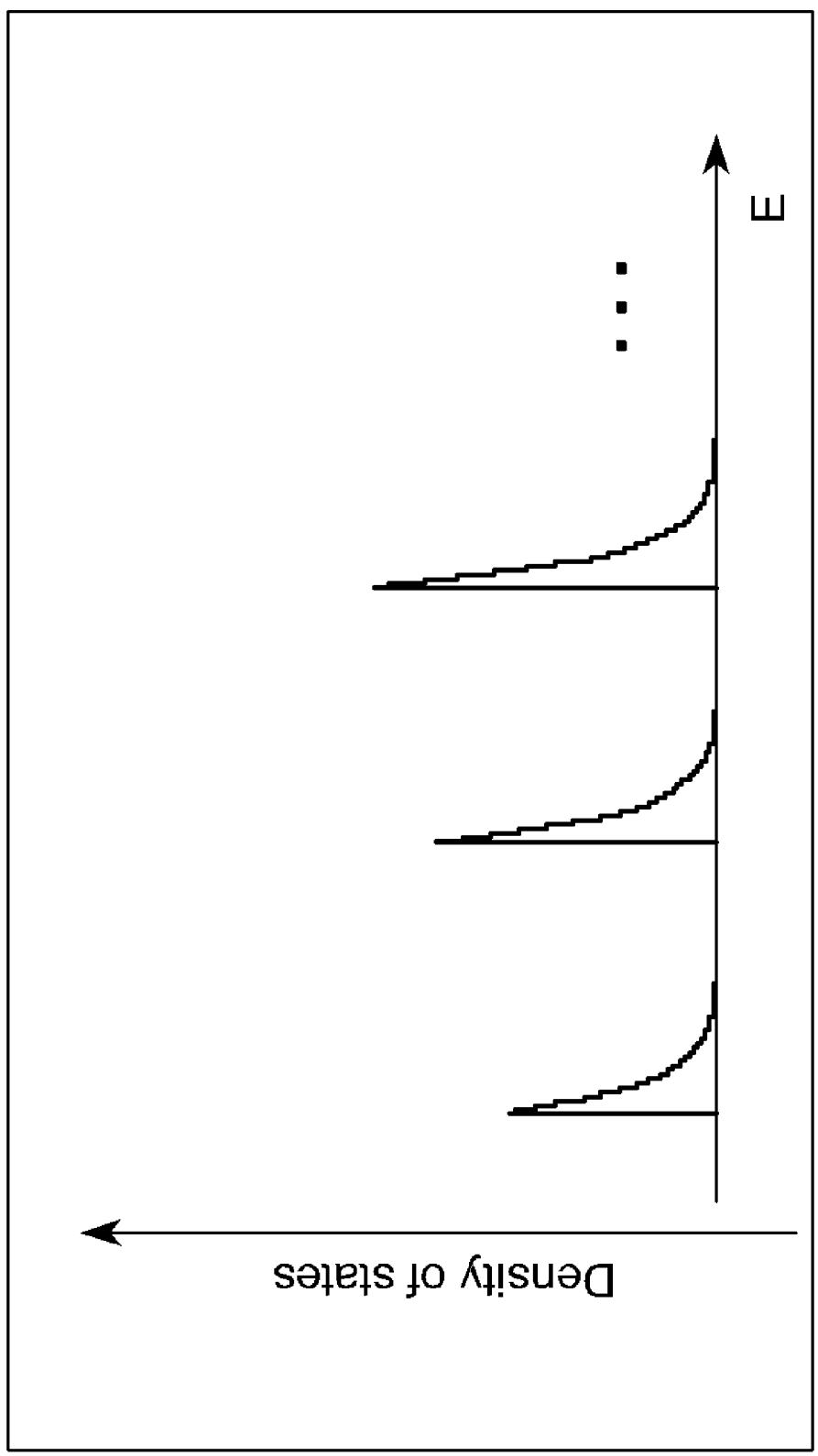
FIG. 9 shows the theoretically expected density of states of 1D structures.

If the nanowires in the individual photoconductor units approach a 1-dimensional density of states profile, as schematically shown in FIG. 9, the absorption is not continuous. This fact can be exploited in the field of spectroscopy, because the lack of absorption in certain wavelength ranges and the enhanced absorption in other wavelength ranges, improves the wavelength distinguishability of the detector.

A person skilled in the art can understand that a combination of all the presented applications as described in the previous section can be implemented and/or altered such that it can lead to other alternatives and applications. These alternatives are also part of the preferred embodiments.

The vertical stacking of nanowires with preferably substantially the same diameter, length and material in between two electrodes to create photoconductor units that can be used to create a photosensitive wavelength detector is illustrated in the preferred embodiments in the field of spectroscopy, telecommunications and color-sensitive cameras but a person skilled in the art can implement it in several other possible application fields wherein these photoconductor units comprising stacked nanowires can be used.

All references cited herein are incorporated herein by reference in their entirety. To the extent publications and Patents or Patent Applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A wavelength-sensitive detector comprising a first photoconductor unit and a second photoconductor unit on a substrate; wherein a plane of the first photoconductor unit and a plane of the second photoconductor unit are substantially parallel to each other and are substantially perpendicular to a plane of the substrate; wherein each photoconductor unit comprises a first electrode having a first longitudinal direction and a first sidewall lying in a first plane parallel with the first longitudinal direction and a second electrode having a second longitudinal direction and a second sidewall lying in a second plane parallel with said second longitudinal direction; wherein the first photoconductor unit comprises a plurality of first type elongate nanostructures positioned in between the first electrode and the second electrode of the first photoconductor unit, the elongate nanostructures each having a longitudinal axis, wherein the longitudinal axes of the first type elongate nanostructures are substantially parallel to each other and are substantially perpendicular to a plane of the first electrode and a plane of the second electrode of the first photoconductor unit; and wherein the second photoconductor unit comprises a plurality of second type elongate nanostructures positioned in between the first electrode and the second electrode of the second photoconductor unit, the elongate nanostructures each having a longitudinal axis, wherein the longitudinal axes of the second type elongate nanostructures are substantially parallel to each other and are substantially perpendicular to a plane of the first electrode and a plane of the second electrode of the second photoconductor unit, wherein the first type elongate nanostructures are different from the second type elongate nanostructures, wherein the detector is configured to determine a polarization of incident radiation, and wherein the first photoconductor unit comprises the first type elongated nanostructures oriented in a first direction and the second photoconductor unit comprises the second type elongated nanostructures oriented in a second direction, wherein the first direction and the second direction are substantially perpendicular to each other, and wherein the first photoconductor unit and the second photoconductor unit are stacked next to each other on the substrate.

2. A wavelength-sensitive detector comprising a first photoconductor unit and a second photoconductor unit on a substrate; wherein a plane of the first photoconductor unit and a plane of the second photoconductor unit are substantially parallel to each other and are substantially perpendicular to a plane of the substrate; wherein each photoconductor unit comprises a first electrode having a first longitudinal direction and a first sidewall lying in a first plane parallel with the first longitudinal direction and a second electrode having a second longitudinal direction and a second sidewall lying in a second plane parallel with said second longitudinal direction; wherein the first photoconductor unit comprises a plurality of first type elongated nanostructures positioned in between the first electrode and the second electrode of the first photoconductor unit, the elongated nanostructures each having a longitudinal axis, wherein the longitudinal axes of the first type elongated nanostructures are substantially parallel to each other and are substantially perpendicular to a plane of the first electrode and a plane of the second electrode of the first photoconductor unit; and wherein the second photoconductor unit comprises a plurality of second type elongated nanostructures positioned in between the first electrode and the second electrode of the second photoconductor unit, the elongated nanostructures each having a longitudinal axis, wherein the longitudinal axes of the second type elongated nanostructures are substantially parallel to each other and are substantially perpendicular to a plane of the first electrode and a plane of the second electrode of the second photoconductor unit, wherein the first type elongated nanostructures are different from the second type elongated nanostructures, wherein the first photoconductor unit comprises first type elongated nanostructures oriented in a first direction, wherein the second photoconductor unit comprises second type elongated nanostructures oriented in a second direction, wherein the first direction and the second direction are different, and wherein the first photoconductor unit and the second photoconductor unit are stacked next to each other on the substrate.

* * * * *

UNITED STATES PATENT AND TRADEMARK OFFICE
CERTIFICATE OF CORRECTION

PATENT NO. : 8,232,517 B2  Page 1 of 1
APPLICATION NO. : 12/574531
DATED : July 31, 2012
INVENTOR(S) : Verhulst et al.

It is certified that error appears in the above-identified patent and that said Letters Patent is hereby corrected as shown below:

| Issued Patent | | Description of Discrepancy |
|---|---|---|
| Column | Line | |
| 4 | 59 | Change "nano structures." to --nanostructures.--. |
| 10 | 63 | Change "3V" to --3 eV--. |
| 14 | 33 | In Claim 1, change "elongate" to --elongated--. |
| 14 | 35 | In Claim 1, change "elongate" to --elongated--. |
| 14 | 37 | In Claim 1, change "elongate" to --elongated--. |
| 14 | 41 | In Claim 1, change "elongate" to --elongated--. |
| 14 | 43 | In Claim 1, change "elongate" to --elongated--. |
| 14 | 45 | In Claim 1, change "elongate" to --elongated--. |
| 14 | 49 | In Claim 1, change "elongate" to --elongated--. |
| 14 | 50 | In Claim 1, change "elongate" to --elongated--. |

Signed and Sealed this
Twenty-sixth Day of February, 2013

Teresa Stanek Rea
*Acting Director of the United States Patent and Trademark Office*